United States Patent [19]

Ishimura

[11] Patent Number: 5,521,742
[45] Date of Patent: May 28, 1996

[54] SEMICONDUCTOR OPTICAL MODULATOR

[75] Inventor: Eitaro Ishimura, Itami, Japan

[73] Assignee: Mitsubishi Denki Kabushiki Kaisha, Tokyo, Japan

[21] Appl. No.: 212,704

[22] Filed: Mar. 14, 1994

[30] Foreign Application Priority Data

Jun. 25, 1993 [JP] Japan .................................. 5-154643

[51] Int. Cl.$^6$ ...................................... G02F 1/03
[52] U.S. Cl. ............................................ 359/248; 257/17
[58] Field of Search ........................... 257/17, 18, 190; 359/245, 246, 247, 248

[56] References Cited

U.S. PATENT DOCUMENTS 5,210,428  5/1993  Goossen ..................................... 257/17

FOREIGN PATENT DOCUMENTS

| 0416879 | 9/1990 | European Pat. Off. . |
| 0483687 | 10/1991 | European Pat. Off. . |
| 351813 | 7/1989 | Japan . |
| 3290614 | 4/1990 | Japan . |
| 342616 | 2/1991 | Japan . |
| 2231969 | 5/1989 | United Kingdom . |

OTHER PUBLICATIONS

Mendez et al, "Stark Localization In GaAs–GaAlAs Superlattices Under An Electric Field", Physical Review Letters, vol. 60, No. 23, Jun. 1988, pp. 2426–2429.

Primary Examiner—Georgia Y. Epps
Assistant Examiner—Dawn-Marie Bey
Attorney, Agent, or Firm—Leydig, Voit & Mayer

[57] ABSTRACT

A semiconductor optical modulator includes a light absorbing layer having a multi-quantum well structure including two quantum wells including quantum well layers bounded and separated by barrier layers, the quantum wells having respective, different ΔEv/ΔEc ratios where ΔEc is the discontinuity between the barrier layer and a quantum well layer in the conduction band edge and ΔEv is the discontinuity between the barrier layer and a quantum well layer in the valence band edge. By this construction, the absorption peak when no electric field is applied significantly shifts toward the longer wavelength side, resulting in a large difference between the absorption peak wavelength when no electric field is applied and the absorption peak wavelength when an electric field is applied, whereby the absorption loss of a semiconductor optical modulator when no electric field is applied is reduced.

2 Claims, 5 Drawing Sheets electric field = 0 electric field = 0 electric field > 0

ABSORPTION SPECTRA OF THE QUANTUM WELLS electric field ≒ 0 electric field > 0

SEMICONDUCTOR OPTICAL MODULATOR

FIELD OF THE INVENTION

The present invention relates to a semiconductor optical modulator and, more particularly, to a modulator with reduced loss.

BACKGROUND OF THE INVENTION

FIG. 7 is a perspective view illustrating a prior art semiconductor optical modulator. In FIG. 7, reference numeral 105 designates an InP substrate. A light absorbing layer 104 having barrier layers and two quantum wells between respective barrier layers is located in the InP substrate 105. An insulating film 103 of silicon dioxide is disposed on the InP substrate 105. A Cr/Au electrode 102 is in contact with the light absorbing layer 104. An Au layer 101 is disposed on the Cr/Au electrode 102.

The energy band diagram of the light absorbing layer 104 is described in, for example, Physical Review Letters, Vol. 60, pp. 2426 (1988), and will be described below.

FIG. 4 shows an energy band diagram of the light absorbing layer 4 when no electric field is applied to the light absorbing layer 4, and FIG. 5 shows an energy band diagram when an electric field is applied to the light absorbing layer 4.

In FIG. 4, reference numeral 10a designates a quantum well layer comprising InAlGaAs having a width W of 7 nm and reference numeral 10b designates a quantum well comprising InAlGaAs having a width W of 7 nm. Reference numeral 2 designates a barrier layer comprising InP having a width L of 3 nm. The energy band gap of the quantum well 10a is Eg(A→A), and the energy band gap between the valence band of the quantum well 10a and the conduction band of the quantum well 10b is Eg(A→B). Further, in FIG. 5, the energy band gap of the quantum well 10a when an electric field is applied is Eg'(A→A) and the energy band gap between the valence band of the quantum well 10a and the conduction band of the quantum well 10b when an electric field is applied is Eg'(A→B).

FIG. 6 shows absorption spectra of the quantum well in a case where an electric field is applied to the light absorbing layer and in a case where no electric field is applied thereto.

A description is given of the operation of this semiconductor optical modulator.

In the energy band diagram in a case where no electric field is applied to the light absorbing layer shown in FIG. 4, the energy band gap Eg(A→A) from the bottom level 1ha (=1hb) of the valence band of the quantum well 10a to the bottom level 1ea (=1eb) of the conduction band of the quantum well 10a and the energy band gap Eg(A→B) from the bottom level 1ha of the valence band of the quantum well 10a to the bottom level 1eb of the conduction band of the quantum well 10b are equal to each other, and the values are both 0.826 eV. Accordingly, as shown by a solid line in FIG. 6 for the absorption spectrum of the light absorbing layer, the absorption peaks of Eg(A→A) and Eg(A→B) overlap with each other at wavelength $\lambda_{Eg}$=1500 nm.

When an electric field is applied to the light absorbing layer, as shown in FIG. 5, the bottom level 1ha of the valence band of the quantum well 10a increases its energy level with an increase in the electric field applied, while the bottom level of the conduction band thereof decreases with the increase in the electric field applied. As a result, the energy band gap Eg'(A→A) when an electric field is applied becomes 0.824 eV, which is lower than the energy band gap Eg(A→A)=0.826 eV that is obtained when no electric field is applied. Similarly as above, the bottom level 1eb of the conduction band of the quantum well 10b also decreases with an increase in the electric field applied, and the energy band gap Eg'(A→B) from the bottom level 1ha of the valence band of the quantum well 10a to the bottom level 1eb of the conduction band of the quantum well 10b becomes 0.811 eV, a smaller value than Eg'(A→A)=0.824 eV. As a result, the following relation stands:

$$Eg(A \rightarrow A) = Eg(A \rightarrow B) > Eg'(A \rightarrow A) > Eg'(A \rightarrow B).$$

Therefore, the absorption peak of Eg(A→A) and the absorption peak of Eg(A→B) respectively shift to the longer wavelength side when an electric field is applied thereto, the absorption spectrum shifts to the broken line in FIG. 6, and the wavelength $\lambda i$ of the absorption peak of the energy gap Eg'(A→B) when an electric field is applied thereto, becomes 1529 nm.

When light of wavelength coincident with the absorption peak of Eg'(A→B), that is, a light of wavelength 1529 nm is incident on the light absorbing layer having such an absorption spectrum, the light is absorbed more, by an amount $\Delta a$, when an electric field is applied than when no electric field is applied. Utilizing this effect, the amount of light transmitted through the light absorbing layer can be adjusted by turning on and off the electric field applied to the light adsorption layer, whereby the incident light is modulated and emitted as a digital signal.

In the prior art semiconductor optical modulator constituted as described above, although ideally no absorption occurs when no electric field is applied and a large absorption occurs when an electric field is applied, actually there is absorption when no electric field is applied as shown in FIG. 6, which in turn results in loss.

SUMMARY OF THE INVENTION

It is an object of the present invention to provide a semiconductor optical modulator that can reduce the absorption loss which unfavourably and inevitably occurs when no electric field is applied.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor optical modulator includes a light absorbing layer having a multi-quantum well structure including two quantum wells, and including a plurality of quantum well layers comprising a material having different ratios ($\Delta Ev/\Delta Ec$) between the energy quantity $\Delta Ec$ of the energy band discontinuity occurring between the barrier layer and the quantum well layer at the conduction band side, and the energy quantity $\Delta Ev$ of the energy band discontinuity occurring between the barrier layer and the quantum well layer at the valence band side.

According to a second aspect of the present invention, a semiconductor optical modulator includes a light absorbing layer including two quantum well layers arranged adjacent to each other with a barrier layer therebetween and respectively comprising two kinds of materials having different ratios of ΔEv/ΔEc.

According to a third aspect of the present invention, a semiconductor optical modulator includes a light absorbing layer including a quantum well layer comprising InGaAsP and a quantum well layer comprising InAlGaAs, which are arranged adjacent to each other with a barrier layer comprising InP or InAlAs therebetween.

According to a fourth aspect of the present invention, the composition of the quantum well layer comprising InGaAsP is $In_{1-x}Ga_xAs_yP_{1-y}$ ($0.53 \leq x \leq 1$, $0 \leq y \leq 1$) and the composition of the quantum well layer comprising InAlGaAs is $(In_xGa_{1-x})_{0.47}Al_{0.53}As$ ($0 \leq x \leq 0.5$).

According to the present invention, the absorption peak when an electric field is applied is significantly shifted toward the longer wavelength side, resulting in a large difference between the absorption peak wavelength when no electric field is applied and the absorption peak wavelength when an electric field is applied, whereby the absorption loss of a semiconductor optical modulator occurring when no electric field is applied is reduced. The modulator employs the wavelength of the absorption peak obtained when an electric field is applied as the wavelength of light to be modulated.

DETAILED DESCRIPTION OF THE PREFERRED EMBODIMENT

Embodiment 1

A first embodiment of the present invention will be described in detail hereinafter.

Figure 7:
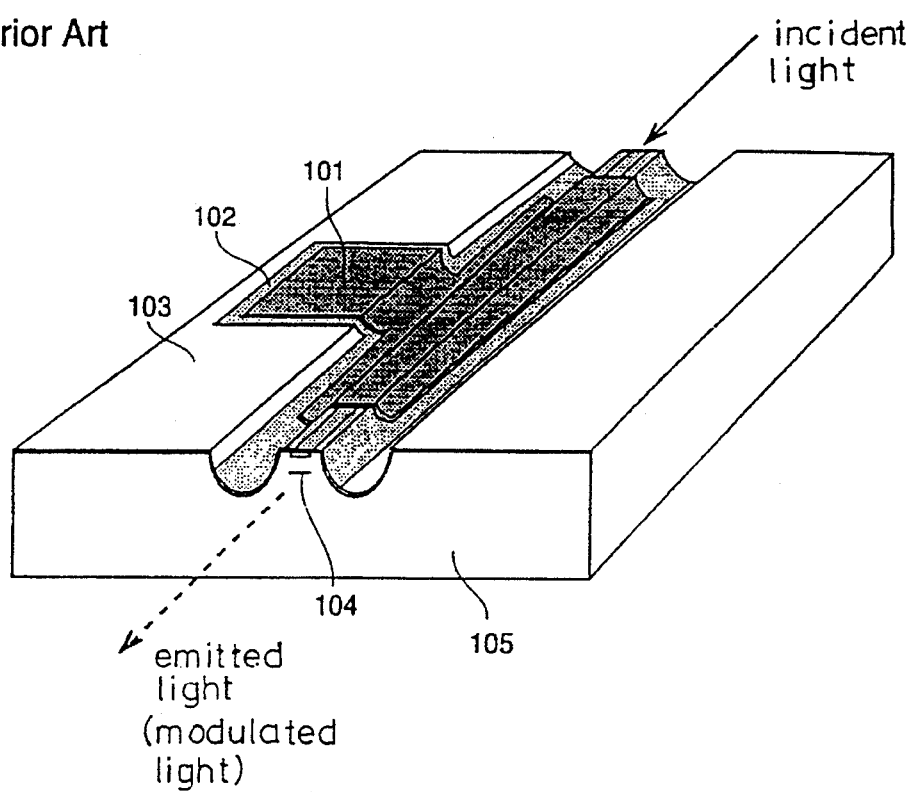
FIG. 7 is a perspective view showing a prior art semiconductor optical modulator.

The structure of the semiconductor optical modulator of this first embodiment is the same as that shown in FIG. 7 except for the structure of the light absorbing layer 104. The light absorbing layer of the present invention will be described below in detail.

Figure 1:
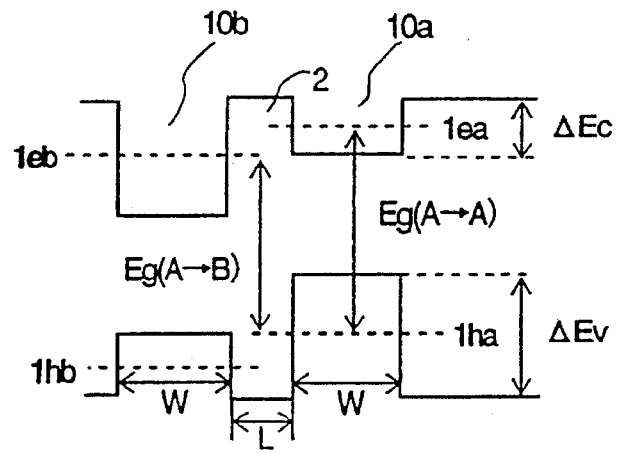
FIG. 1 is an energy band diagram showing the energy band, when no electric field is applied, of the multi-quantum well light absorbing layer according to a first embodiment of the present invention.

FIG. 1 shows an energy band diagram of the light absorbing layer in a case where no electric field is applied to the light absorbing layer of a semiconductor optical modulator according to this first embodiment. In FIG. 1, a quantum well 10a comprises InGaAsP, its composition is $In_{0.63}Ga_{0.37}As_{0.82}P_{0.18}$ and its width W is 7 nm. A quantum well 10b comprises InAlGaAs, its composition is $(In_{0.06}Ga_{0.94})_{0.47}Al_{0.53}As$ and its width is 7 nm. A barrier layer 2 comprises InP, and its width L is 3 nm. Reference characters ΔEc and ΔEv represent energy band discontinuities of the conduction band and the valence band, respectively, and reference numerals 1ea, 1eb, 1ha, and 1hb represent the bottom level of the conduction band side and the valence band side of the quantum wells 10a and 10b, respectively. Reference character Eg(A→A) represents the energy band gap between the bottom level 1ea and the bottom level 1ha of the quantum well 10a and reference character Eg(A→B) represents energy band gap between the bottom level 1ha of the quantum well 10a and the bottom level 1eb of the quantum well 10b.

Figure 2:
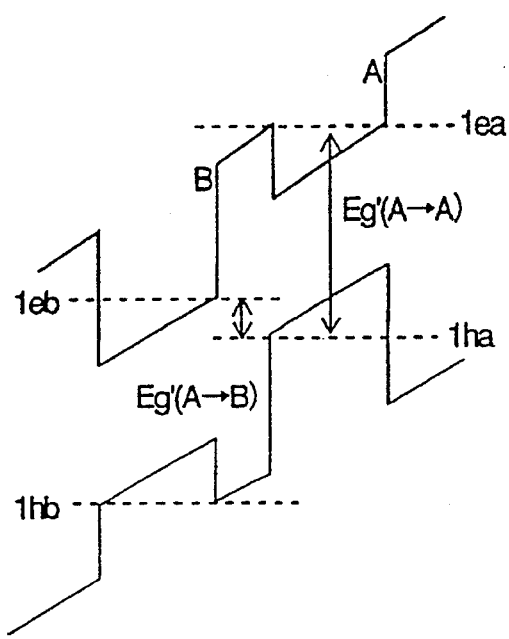
FIG. 2 is an energy band diagram corresponding to that of FIG. 1 when an electric field is applied.

FIG. 2 shows an energy band diagram of the light absorbing layer in a case where an electric field is applied to the light absorbing layer, where Eg'(A→A) represents an energy band gap between the bottom levels 1ea and 1ha of the quantum well 10a and Eg'(A→B) represents an energy band gap between the bottom level 1ha of the quantum well 10a and the bottom level 1eb of the quantum well 10b when an electric field is applied to the light absorbing layer.

Figure 3:
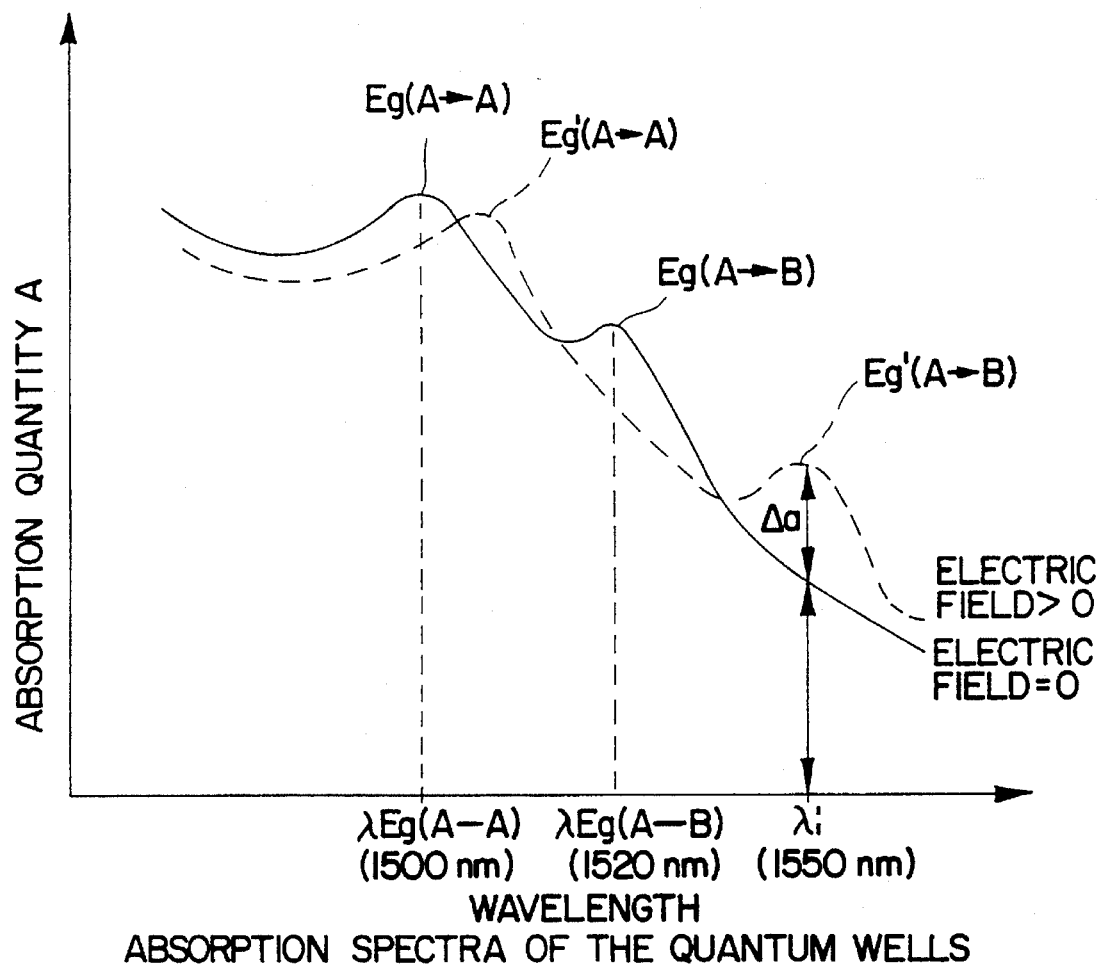
FIG. 3 is a diagram showing absorption spectra of a multi-quantum well according to the first embodiment of the present invention.
Figure 4:
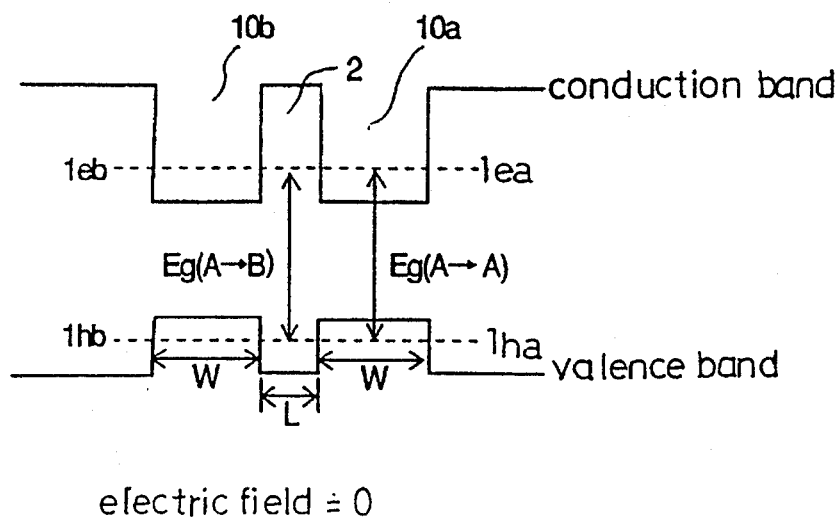
FIG. 4 is an energy band diagram showing the energy band edges of a multi-quantum well light absorbing layer according to the prior art when no electric field is applied.
Figure 5:
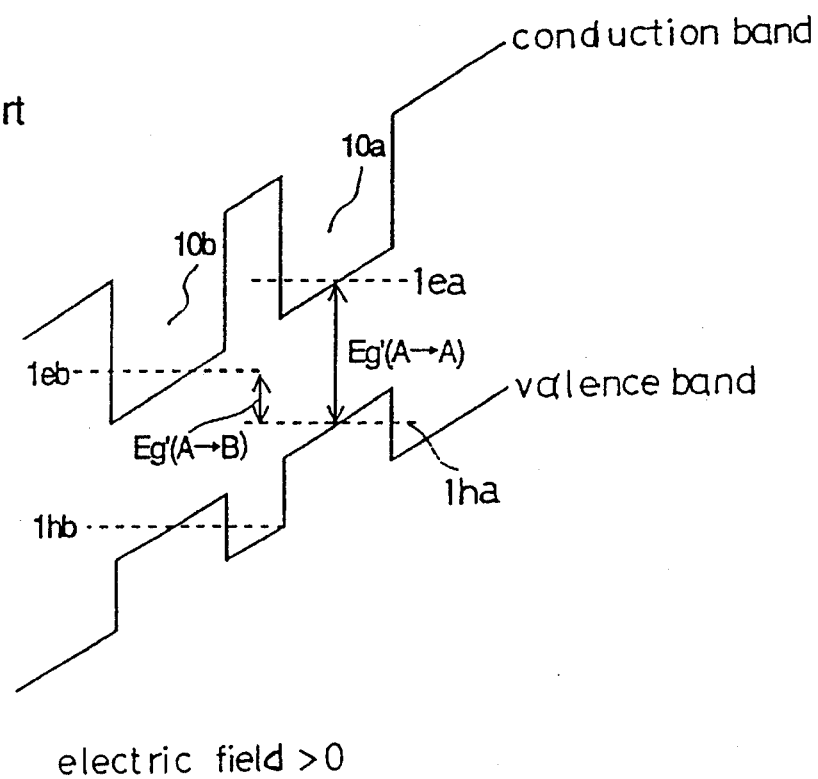
FIG. 5 is an energy band diagram of a multi-quantum well light absorbing layer according to the prior art when an electric field is applied.

FIG. 3 shows absorption spectra of the quantum wells 10a and 10b when an electric field is applied to the light absorbing layer and when no electric field is applied thereto, respectively.

A description is given of the operation of the semiconductor optical modulator of this embodiment.

First of all, if it is supposed that the band discontinuity quantity between the barrier layer 2 and the quantum well layers 10a and 10b is ΔEg, the energy discontinuity quantity ΔEc arising in the conduction band side and the energy discontinuity quantity ΔEv arising in the valence band side, then ΔEg=ΔEc+ΔEv, and the ratio (ΔEv/ΔEc) between ΔEc and ΔEv is inherent to the material. When InP is used for the barrier layer 2 and InGaAsP is used for the quantum well 10a, the ratio ΔEv/ΔEc=2, and when InAlGaAs is used for the quantum well layer 10b, the ratio ΔEv/ΔEc=0.5. Accordingly, the energy band diagram of the light absorbing layer having the barrier layer 2, the quantum well layer 10a, and the quantum well layer 10b when no electric field is applied becomes as shown in FIG. 1.

Furthermore, because the width of the quantum well layer 10a is 7 nm and its material composition is $In_{0.63}Ga_{0.37}As_{0.82}P_{0.18}$, the energy gap Eg(A→A) between the bottom level 1ea and the bottom level 1ha of the quantum well 10a becomes 0.826 eV, and because the width of the quantum well 10b is 7 nm and its material composition is $(In_{0.06}Ga_{0.94})_{0.47}Al_{0.53}As$, the energy gap Eg(A→B) from the bottom level 1ha of the quantum well 10a to the bottom level 1eb of the quantum well 10b is 0.815 eV. In other words, the relation between the Eg(A→A) and Eg(A→B) is Eg(A→A)>Eg(A→B), and its absorption spectrum becomes one showing absorption peaks at wavelength $\lambda_{Eg(A \to A)}$=1500 nm and at wavelength $\lambda_{Eg(A \to B)}$=1520 nm.

When an electric field of 1.5 kV/cm is applied to the light absorbing layer, the energy gap Eg'(A→A) between the bottom level 1ea and the bottom level 1ha of the quantum well 10a when an electric field is applied and the energy gap Eg'(A→B) between the bottom level 1ha of the quantum well 10a and the bottom level 1eb of the quantum well 10b becomes 0.800 eV. Accordingly, the absorption spectrum when an electric field is applied has an absorption peak of Eg(A→B) shifted toward the longer wavelength side as shown by a broken line in FIG. 3, resulting an absorption peak of Eg'(A→B) at wavelength λi of 1550 nm.

When light of wavelength of 1550 nm is incident on the light absorbing layer representing the absorption spectrum shown in FIG. 3, a larger amount of light by Δa is absorbed when a positive electric field is applied than when no electric field is applied, and therefore the incident light is absorbed or transmitted by turning on or off the electric field, whereby modulation of the light occurs.

Figure 6:
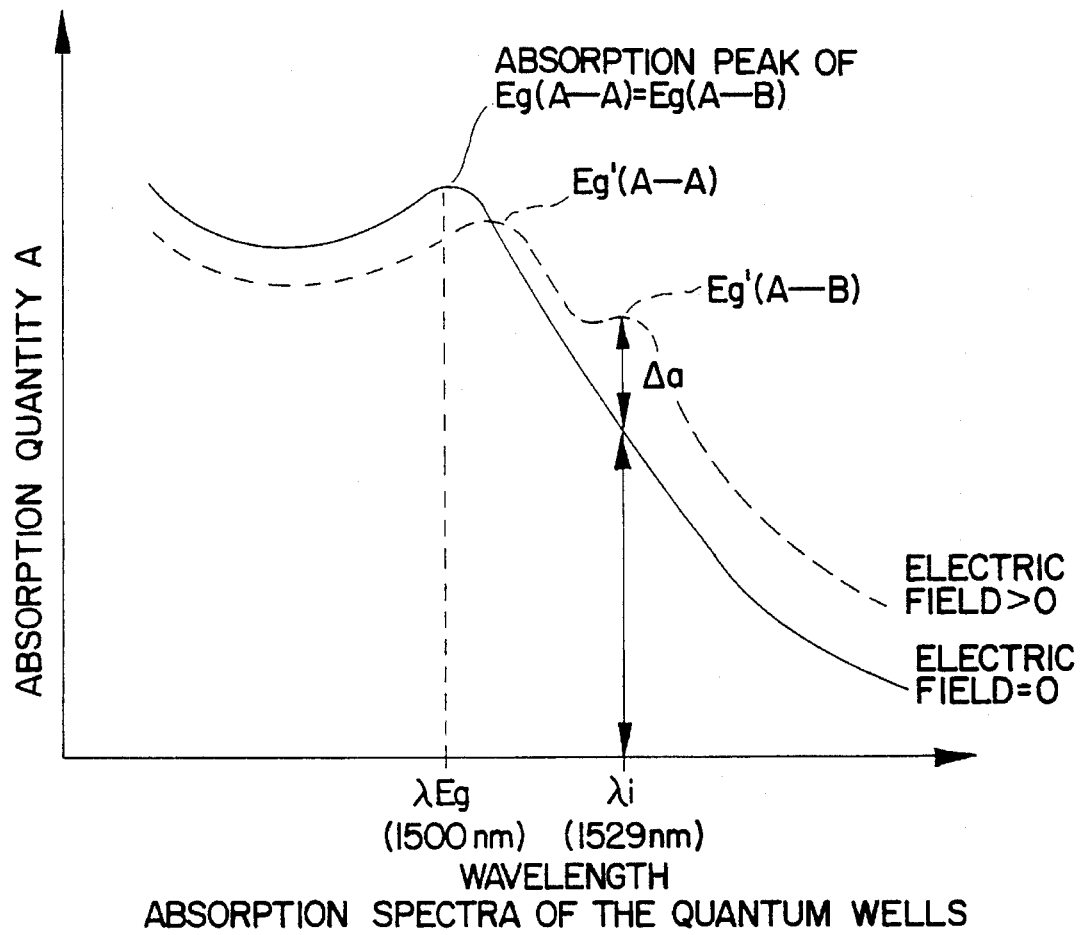
FIG. 6 is a diagram showing absorption spectra of a multi-quantum well according to the prior art.

The more the absorption peak wavelength λi of Eg'(A→B) is spaced from the absorption peak wavelength $\lambda_{Eg(A\to A)}$ of Eg(A→A), the less the absorption loss when no electric field is applied. Referring to FIG. 6 showing the absorption spectrum of the quantum well of the prior art device, the difference between the absorption peak wavelength $\lambda_{Eg}$ of Eg(A→A) and the absorption peak wavelength λi of Eg'(A→B) is 1529 nm−1500 nm=29 nm. In this embodiment, however, the difference between the absorption peak wavelength $\lambda_{Eg(A\to A)}$ of Eg(A→A) and the absorption peak wavelength λi of Eg'(A→B) is 1550 nm−1500 nm=50 nm, meaning that the absorption peak wavelength λi of the Eg'(A→B) is shifted more toward the longer wavelength side than in the prior art device by 21 nm so that the absorption loss when no electric field is applied is reduced relative to the prior art device.

In this semiconductor optical modulator embodiment, InP is used for the barrier layer 2 of the light absorbing layer, and the quantum well layers 10a and 10b comprise InGaAsP and InAlGaAs having different ratios (ΔEv/ΔEc), respectively. Thereby, the absorption peak wavelength λi when an electric field is applied is significantly shifted to the longer wavelength side, whereby the absorption peak wavelength $\lambda_{Eg}$ when no electric field is applied and the absorption peak wavelength λi when the electric field is applied are significantly separated from each other, and thus the absorption loss when no electric field is applied, is significantly reduced.

While in the above-described embodiment InP is used for the barrier layer 2, the composition of the quantum well layer 10a is $In_{0.63}Ga_{0.37}As_{0.82}P_{0.18}$, and the composition of the quantum well layer 10b is $(In_{0.06}Ga_{0.94})_{0.47}Al_{0.53}As$, in the present invention InAlAs may be used for the barrier layer 2, the composition of the quantum well layer 10a may be in a range of $In_{1-x}Ga_xAs_yP_{1-y}$ (0.53≦x≦1, 0≦y≦1), and the composition of the quantum well layer 10b in a range of $(In_xGa_{1-x})_{0.47}Al_{0.53}As$ (0≦x≦0.5), with the same effect of reducing the absorption loss as in the above-described embodiment.

Japanese Published Patent Application Hei. 3-42616 discloses a semiconductor optical modulator in which grooves of lower energy potential than the energy potential of the bottom of the respective quantum wells are provided at the bottom of the respective quantum wells, so that electrons or holes are confined in these grooves, whereby the respective wave functions of electrons and holes do not overlap with each other and do not extend out of respective quantum wells, and thus the absorption coefficient obtained when no electric field is applied is reduced by a great extent at a desired wavelength. However, this modulator has no relation to a semiconductor optical modulator as in the present invention, in which the absorption peak wavelength when an electric field is applied is shifted toward the longer wavelength side, modulation is performed utilizing the shifted absorption peak wavelength, and thereby absorption loss when no electric field is applied is reduced.

Japanese Published Patent Application Hei. 1-204019 discloses an optical modulator in which there are provided first and third well layers of the same material and thickness, and second well layers of a different material and thickness from the first and the third well layers. A barrier layer is located between the first and third well layers, so that the respective wave functions of the electrons and holes in respective well layers do not overlap with each other when an electric field is applied, whereby the loss when an electric field is applied is reduced. However, this modulator has no relation to a semiconductor optical modulator as in the present invention, in which, in order to reduce the loss when no electric field is applied, the absorption peak wavelength when an electric field is applied is shifted toward the longer wavelength side, the modulation is performed using this absorption peak wavelength, and the absorption loss when no electric field is applied is reduced.

As is evident from the foregoing description, according to the present invention, in a semiconductor optical modulator having a light absorbing layer in a multi-quantum well structure comprising more than two quantum wells, the light absorbing layer comprises a plurality of quantum well layers comprising materials having respective different ratios of the conduction band discontinuity between the barrier layer and the quantum well layer to the same discontinuity in the valence band side, whereby the absorption peak when an electric field is applied is shifted toward the longer wavelength side, and the absorption peak wavelength when no electric field is applied and the absorption peak wavelength when an electric field is applied are significantly spaced from each other. Therefore, by utilizing the absorption peak wavelength that is obtained when an electric field is applied as a wavelength of the light to be modulated, the absorption loss when no electric field is applied is reduced, and a low loss semiconductor optical modulator is obtained.

What is claimed is:

1. A semiconductor optical modulator including a light absorbing layer having a multi-quantum well structure including two quantum wells comprising a barrier layer and two quantum well layers separated by and adjacent the barrier layer, the quantum well and barrier layers being semiconductor materials having respective energy bands, each energy band including a conduction band edge and a valence band edge, wherein the quantum wells have different (ΔEv/ΔEc) ratios, ΔEc is an energy band discontinuity between the barrier layer and a quantum well layer in the conduction band edge, ΔEv is an energy band discontinuity between the barrier layer and a quantum well layer in the valence band edge, a first of the quantum well layers is InGaAsP, a second of the quantum well layers is InAlGaAs, and the barrier layer is InP.

2. A semiconductor optical modulator including a light absorbing layer having a multi-quantum well structure including two quantum wells comprising a barrier layer and two quantum well layers separated by and adjacent the barrier layer, the quantum well and barrier layers being semiconductor materials having respective energy bands, each energy band including a conduction band edge and a valence band edge, wherein said quantum wells have different (ΔEv/ΔEc) ratios, ΔEc is an energy band discontinuity between the barrier layer and a quantum well layer in the conduction band edge, ΔEv is an energy band discontinuity between the barrier layer and a quantum well layer in the valence band edge, a first of the quantum well layers is $In_{1-x}Ga_xAs_yP_{1-y}$ (0.53≦x≦1, 0≦y≦1), a second of the quantum well layers is $(In_xGa_{1-x})_{0.47}Al_{0.53}As$ (0≦x≦0.5), and the barrier layer is InAlAs.

* * * * *